(12) United States Patent
Howland

(10) Patent No.: US 6,842,029 B2
(45) Date of Patent: Jan. 11, 2005

(54) NON-INVASIVE ELECTRICAL MEASUREMENT OF SEMICONDUCTOR WAFERS

(75) Inventor: William H. Howland, Wexford, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/120,661

(22) Filed: Apr. 11, 2002

(65) Prior Publication Data

US 2003/0227292 A1 Dec. 11, 2003

(51) Int. Cl.⁷ .............................................. G01R 31/02
(52) U.S. Cl. ..................................................... 324/765
(58) Field of Search ................................ 324/716, 719, 324/765–767, 769, 158.1, 754, 715, 500; 438/14, 15, 17, 18; 257/40–48

(56) References Cited

U.S. PATENT DOCUMENTS

| | | | |
|---|---|---|---|
| 3,731,191 A | 5/1973 | Bullard et al. ............ 324/158 F |
| 4,035,722 A | 7/1977 | Ryabov et al. ............ 324/158 P |
| 4,038,599 A | 7/1977 | Bove et al. ............... 324/158 F |
| 4,585,991 A | 4/1986 | Reid et al. ................ 324/158 P |
| 4,912,066 A | 3/1990 | Willis .......................... 437/173 |
| 5,094,975 A | 3/1992 | Siu .............................. 437/89 |
| 5,172,050 A * | 12/1992 | Swapp ........................ 324/762 |
| 5,228,189 A | 7/1993 | Driller et al. .................. 29/705 |
| 5,293,516 A * | 3/1994 | Fouere et al. ................ 324/756 |
| 5,491,427 A | 2/1996 | Ueno et al. .................. 324/754 |
| 5,973,504 A | 10/1999 | Chong ......................... 324/754 |
| 6,174,744 B1 * | 1/2001 | Watanabe et al. ............. 438/14 |
| 6,218,846 B1 | 4/2001 | Ludwig et al. ............. 324/713 |
| 6,492,827 B1 * | 12/2002 | Mazur et al. ................ 324/761 |
| 6,741,093 B2 * | 5/2004 | Howland et al. ........... 324/765 |
| 2002/0024351 A1 | 2/2002 | Eriguchi et al. | |

* cited by examiner

Primary Examiner—N. Le
Assistant Examiner—Donald M. Lair
(74) Attorney, Agent, or Firm—Webb Ziesenheim Logsdon Orkin & Hanson, P.C.

(57) ABSTRACT

A multi-probe assembly includes a chuck assembly configured to receive a back or front surface of a semiconductor wafer. A multi-probe holder has a plurality of probes each having an elastically deformable conductive tip movable into contact with a front surface of a dielectric or a front surface of a semiconducting material. A means applies an electrical stimulus to each tip, measures a response to the electrical stimulus, and determines at least one electrical property of the dielectric and/or the semiconducting material. A method for measuring at least one electrical property applies a probe (or plurality of probes) having an elastically deformable conductive tip to a scribe line(s). An electrical stimulus is applied to the probe or one of the probes with the remaining probes grounded. A response to the electrical stimulus is measured and at least one electrical property of the semiconductor wafer is determined from the response.

17 Claims, 6 Drawing Sheets

NON-INVASIVE ELECTRICAL MEASUREMENT OF SEMICONDUCTOR WAFERS

BACKGROUND OF THE INVENTION

1. Field of the Invention

This invention relates generally to an apparatus and method for measuring electrical properties of a semiconductor wafer.

2. Description of Related Art

The determination of electrical properties of a dielectric on a semiconductor wafer and/or a carrier density profile within the semiconductor wafer is a critical factor in the production of such wafers. Measurements based on capacitance-voltage (CV) or capacitance-time (Ct) techniques, such as measurements of dielectric thickness, oxide charge, threshold voltage, implant dose and carrier profile; measurements based on conductance-voltage (GV) techniques, such as measurement of interface state density; and measurements based on current-voltage (IV) techniques, such as dielectric leakage current and breakdown voltage, are typically accomplished by first fabricating metal or doped polysilicon gates on the dielectric. These gates become part of a metal oxide semiconductor (MOS) structure which is used to make the appropriate CV, Ct, GV or IV measurement. In other words, these gates become permanent gates on the semiconductor wafer, thereby making the semiconductor unfit for normal use. Thus, these semiconductor wafers are used only as monitor or test semiconductor wafers.

Fabrication of the metal or polysilicon gates is time-consuming and costly. It typically involves depositing and forming aluminum metal or polysilicon gates on the dielectric in a manner known in the art.

An alternative to these fabricated gates is described in an article entitled "Vacuum Operated Mercury Probe for CV Plotting and Profiling" by Albert Lederman, Solid State Technology, August 1981, pp. 123–126. This article discloses utilizing mercury contacts for replacing the aluminum or polysilicon gates in CV measurement techniques designed to characterize dielectric and semiconductor properties. The Lederman paper discloses a vacuum operated mercury probe for performing measurements of metal oxide semiconductors, homogeneous semiconductor wafers, non-homogeneous semiconductor wafers, and semiconductor wafers on insulating substrates. Problems may arise utilizing the Lederman mercury probe in that mercury may react chemically with the materials of the wafer under study. Mercury also poses a significant safety problem in its use and mercury sublimes at elevated temperatures when accelerated temperature testing of the semiconductor wafer is desired. Thus, a mercury probe has limited application.

An alternative to fabricated gates or vacuum operated mercury probes is disclosed in U.S. Pat. No. 5,023,561 to Hillard which issued on Jun. 11, 1991 and which is incorporated herein by reference.

The Hillard patent discloses a kinematic probe arm having at one end thereof a probe including a tip having a uniformly flat surface of predetermined dimensions. A probe stand supports the kinematic arm and a chuck supports the semiconductor wafer. The probe stand, the kinematic arm, and the chuck are configured so that a planar contact can be realized between the uniformly flat portion of the tip and the front surface of the dielectric layer of the semiconductor wafer.

When the Hillard patent was filed in the early 1990's, a typical gate oxide thickness in the semiconductor industry was on the order of hundreds of angstroms. The relatively small planar contact area between the uniformly flat tip of the probe and the outer surface of the dielectric layer on the wafer resulted in a poor capacitance signal-to-noise ratio when applied to these relatively thick oxides. Hence, while the probe having the uniformly flat tip could be utilized for performing CV Ct or GV measurements, this probe was preferably utilized to perform IV measurements.

In contrast, today, gate oxides are very thin, on the order of 1.0–1.5 nm. With these thin oxides, the capacitance signal-to-noise ratio is increased whereby CV, Ct and GV measurements made with conductive pressure contacts can be effectively utilized to characterize gate oxides.

A problem with utilizing the probe disclosed in the Hillard patent for performing CV measurements is the need to grind the tip uniformly flat. Another problem is the need to establish a planar contact between the uniformly flat tip and the outer surface of the dielectric layer of the wafer. The use of a uniformly flat tip to form a planar contact with the outer surface of the dielectric layer is particularly a problem with today's thin oxide layers since a lack of perfect parallelism between the uniformly flat tip and the outer surface of the dielectric layer may result in an edge surrounding the uniformly flat tip damaging the oxide layer.

Another alternative to permanent gates or temporary mercury gates on monitor semiconductor wafers is the use of test structures formed in scribe lines of product semiconductor wafers. More specifically, test structures are formed in scribe lines of the semiconductor wafer during formation of integrated circuits in the semiconductor wafer. In order to test these test structures, the backside of the semiconductor wafer is received on a wafer chuck. A contact is then formed between the test structure and a distal end of a conventional probe that is connected in circuit with a measurement means and the wafer chuck. The measurement means applies a suitable signal to the test structure via the distal end of the probe tip and measures the response of the test structure to the stimulation.

One problem with forming test structures in scribe lines of product semiconductor wafers includes the additional processing steps necessary to form these test structures. Another problem is the need to test these test structures apart from the testing of the integrated circuits formed on the product semiconductor wafer.

It is, therefore, an object of the present invention to avoid or overcome the above problems and others by providing a probe having an improved tip configuration that enables improved measurement of a dielectric layer or a surface a semiconductor wafer. It is another object of the present invention to eliminate the need for lateral movement between the probe and the wafer in order to test various locations of the wafer. It is a further object of the present invention to eliminate the need to use the back surface of the semiconductor wafer for a return contact. It is yet a further object of the present invention to eliminate the need for monitor or test semiconductor wafers and to provide a method for taking CV, Ct, and GV and IV measurements using the scribe lines of product semiconductor wafers without first forming test structures. Still other objects of the present invention will become apparent to those of ordinary skill in the art upon reading and understanding the following detailed description.

SUMMARY OF THE INVENTION

Accordingly, I have invented a semiconductor wafer multi-probe assembly and method for using the same for measuring at least one electrical property of a semiconductor wafer. The semiconductor wafer multi-probe assembly has a chuck assembly configured to receive a back or front surface of a semiconductor wafer. The multi-probe assembly includes a multi-probe holder having a plurality of probes. Each probe has an elastically deformable conductive tip that is movable into contact with (i) a front surface of a dielectric formed on a front surface of semiconducting material forming the semiconductor wafer or (ii) a front surface of the semiconducting material. A means is provided for applying an electrical stimulus to one of the elastically deformable conductive tips while grounding the remaining tips, for measuring a response to the electrical stimulus, and for determining from the response at least one electrical property of the dielectric and/or the semiconducting material. The means then applies the electrical stimulus to another of the tips, while grounding the remaining tips. This is repeated for each tip.

The multi-probe assembly allows for the simultaneous application of many elastic probes to a dielectric or semiconductor surface. Consequently, the semiconductor wafer surface can be mapped without the need for lateral movement between the semiconductor wafer surface and a probe.

We have also invented a method for measuring at least one electrical property at a scribe line of a product semiconductor wafer. The method includes contacting a probe or plurality of probes, as discussed above, to a product semiconductor wafer scribe line or lines. The application of the probe to the scribe line eliminates the need for test structures. The elastically deformable conductive tip acts as a temporary metal gate in the scribe line during measurements. This allows for fast CV and IV measurements to be made on product semiconductor wafers and eliminates the need for monitor or test semiconductor wafers.

DETAILED DESCRIPTION OF THE PREFERRED EMBODIMENTS

Figure 2:
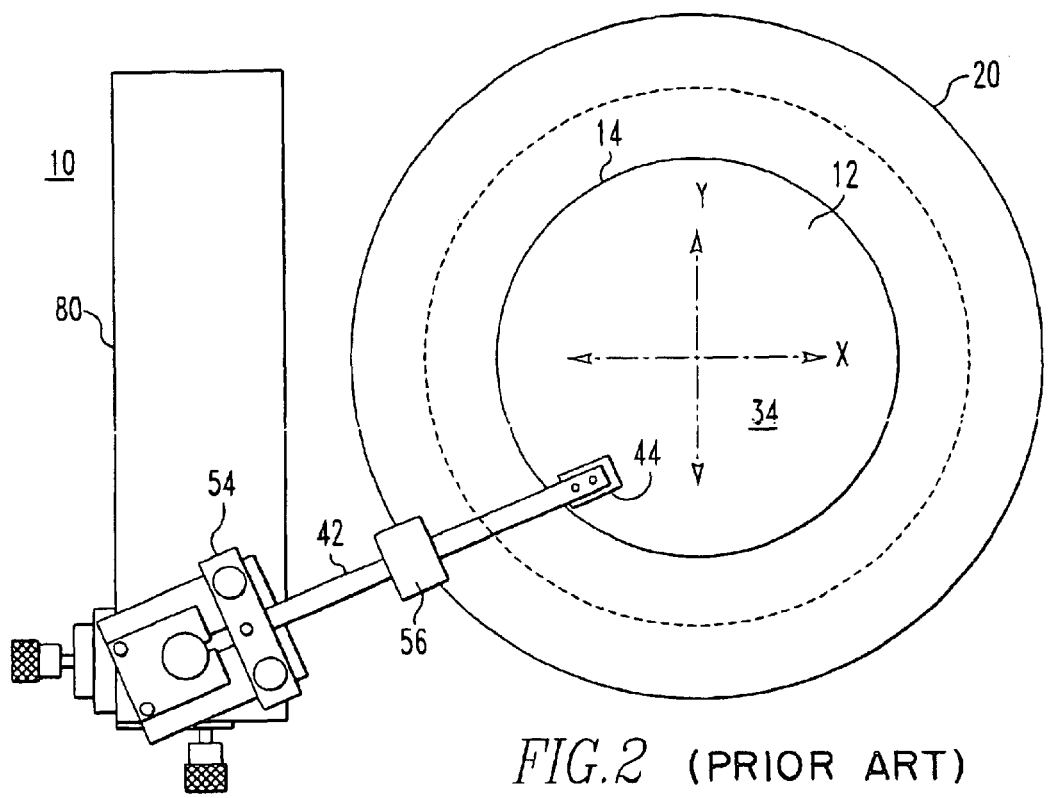
FIG. 2 is a plan view of the apparatus shown in FIG. 1.
Figure 1:
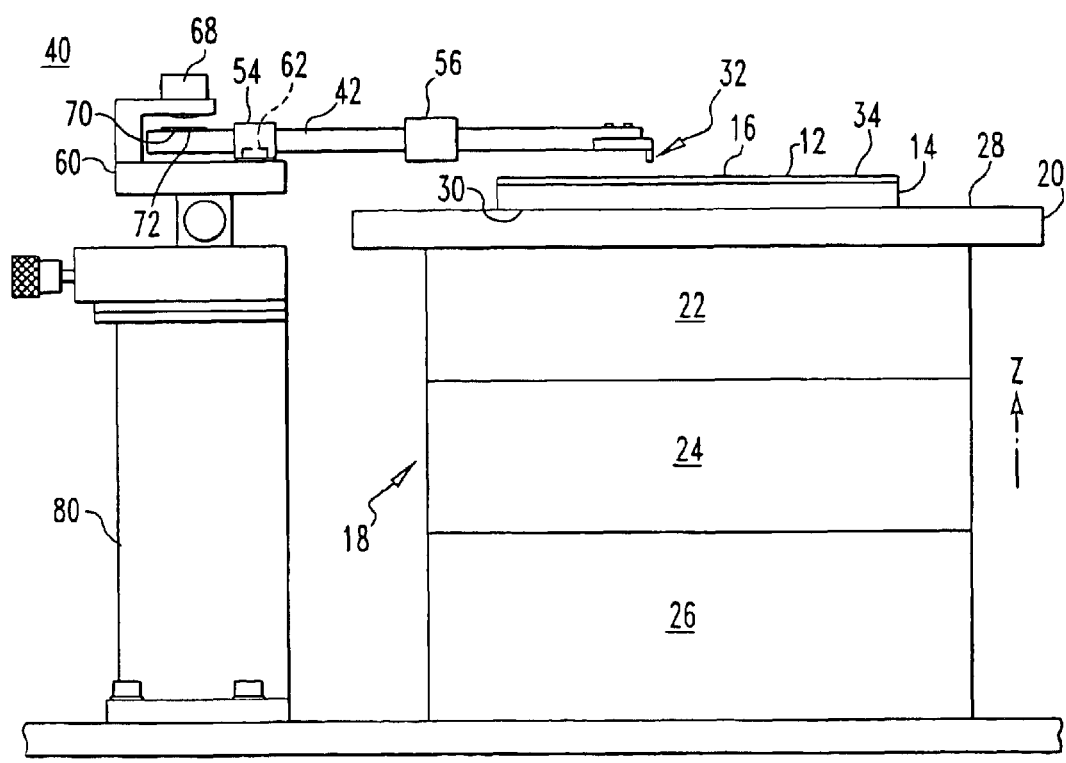
FIG. 1 is an elevational view, partially in section, of an apparatus for testing a semiconductor wafer.
Figure 3:
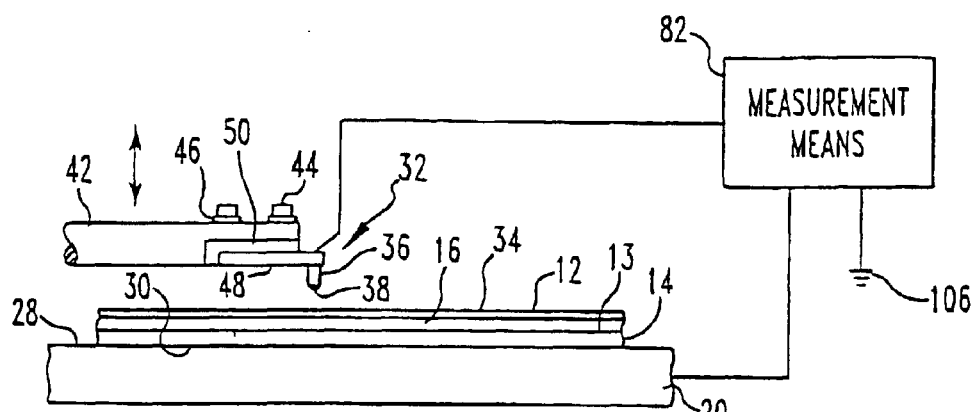
FIG. 3 is a schematic elevational sectional view of a probe in position above a semiconductor wafer to be tested in circuit with a measurement means.

Referring to FIGS. 1–3, an apparatus 10 for measuring electrical properties of a dielectric 12 on a front surface 13 of a semiconductor wafer 14 or in a region 16 of the semiconducting material adjacent the front surface 13 of the semiconductor wafer 14 includes a movable stage assembly 18. Movable stage assembly 18 includes a vacuum chuck 20 which holds semiconductor wafer 14 by means of vacuum. Preferably, movable stage assembly 18 includes a first or rotary stage 22 for rotating semiconductor wafer 14 in an X-Y plane, a second or Z stage 24 for adjusting the vertical position of semiconductor wafer 14, and a third or X/X-Y stage 26 for moving semiconductor wafer 14 in an X or X-Y direction, respectively.

Apparatus 10 includes a first electrical contact 32 for contacting an upper or front surface 34 of dielectric 12. First electrical contact 32 includes a conductive probe 36 preferably having a cylindrically-shaped stainless steel shank. Chuck 20 includes an upper or front surface 28 which defines a second electrical contact for contacting a back surface 30 of semiconductor wafer 14.

Figure 4:
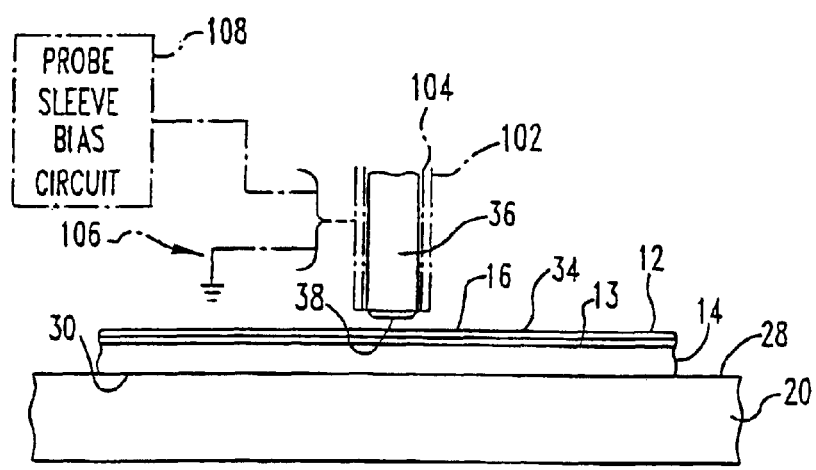
FIG. 4 is an enlarged elevational view of the probe tip shown in FIG. 3 in position above the semiconductor wafer to be tested.

With reference to FIG. 4, and with continuing reference to FIGS. 1–3, a distal end of conductive probe 36 includes a contact portion or tip 38 affixed thereto. A surface of tip 38 facing away from conductive probe 36 preferably has the form of a truncated sphere, e.g., a hemisphere, having a radius of curvature preferably between 10 $\mu$m and 100 cm. Tip 38 is formed from an elastically deformable and conductive material, such as a smooth highly polished metal, such as tantalum, a conductive elastomer, or a conductive polymer.

Apparatus 10 includes a kinematic probe arm assembly 40 having a probe arm 42 with conductive probe 36 affixed thereto by screws 44 and insulating washers 46. Conductive probe 36 is electrically connected to a conductive probe mount 48 which is isolated from probe arm 42 by an insulator 50 connected therebetween. Kinematic probe arm assembly 40 controls the rate of descent of conductive probe 36 and avoids tip 38 from scrubbing front surface 34 of dielectric 12 of semiconductor wafer 14 and causing damage to tip 38 or dielectric 12. Moreover, kinematic probe arm assembly 40 controls a force with which tip 38 is applied to front surface 34 of dielectric 12 and the rate this force is applied thereto.

With reference to FIGS. 5–8, and with ongoing reference to FIGS. 1–4, kinematic probe arm assembly 40 includes an assembly 54 for pivotally supporting probe arm 42 and a probe arm weight 56 slidably received on probe arm 42 for fixing a load on tip 38 of conductive probe 36, preferably between 5 and 200 grams. A lower-bearing plate 60 includes bearing balls 62 received in a V-groove 64 and a trihedral hollow 66 of assembly 54.

Figure 8:
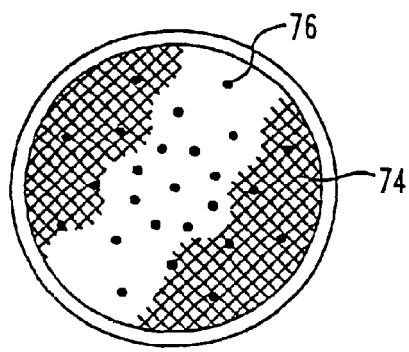
FIG. 8 is an enlarged view of a lifter pad wire mesh of the kinematically stable probe arm shown in FIG. 5.
Figure 5:
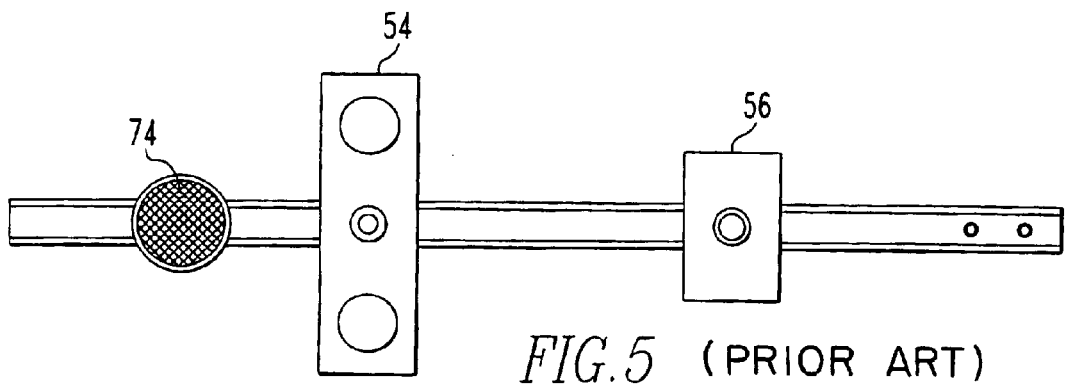
FIG. 5 is an isolated plan view of a kinematically stable probe arm of the apparatus shown in FIG. 2.
Figure 6:
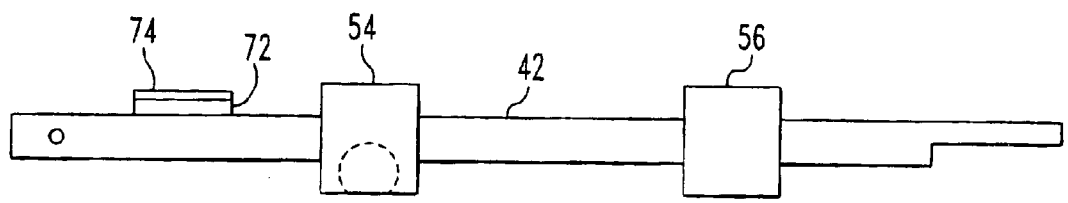
FIG. 6 is a side view of the kinematically stable probe arm shown in FIG. 5.
Figure 7:
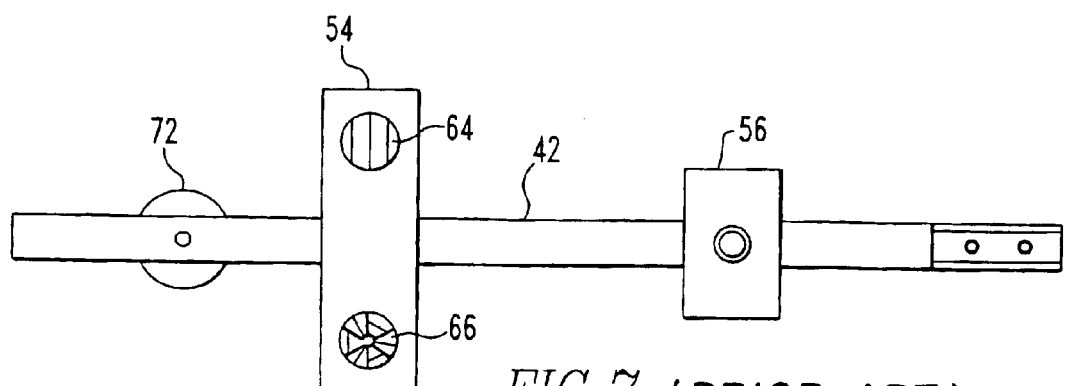
FIG. 7 is a bottom view of the kinematically stable probe arm shown in FIG. 5.

Probe arm 42 is raised and lowered by a pneumatic probe lift 68 which includes a rubber diaphragm 70 to contact an arm lifter pad 72 which is covered by a wire mesh 74, shown in FIGS. 5 and 8. Wire mesh 74 is held to arm lifter pad 72 by spot welds 76. To raise the end of probe arm 42 having conductive probe 36 thereon, air pressure inflates diaphragm 70 to contact wire mesh 74.

High quality contact formation between tip 38 and upper surface 34 of dielectric 12 is made by controlling the loading characteristics of probe arm 42, specifically by controlling the rate pneumatic probe lift 68 causes tip 38 of conductive probe 36 to apply pressure to upper surface 34 of dielectric 12. A probe stand 80 supports probe arm 42 at a desired position relative to semiconductor wafer 14.

In operation, semiconductor wafer 14 is received on vacuum chuck 20 and is held thereon by a vacuum. Upper surface 28 of vacuum chuck 20, which also functions as a second electrical contact, is connected in circuit with a measurement means 82, shown in FIG. 3. Z stage 24 is adjusted in a manner known in the art to move semiconductor wafer 14 vertically. X/X-Y stage 26 controls horizontal movement of semiconductor wafer 14 and rotary stage 22 controls rotational movement of semiconductor wafer 14 in a manner known in the art. Preferably, vacuum chuck 20 is electrically isolated from the remainder of movable stage assembly 18.

When back surface 30 of semiconductor wafer 14 is received on upper surface 28 of vacuum chuck 20, conductive probe 36 is kinematically controlled by kinematic probe arm assembly 40 to establish contact between tip 38 and upper surface 34 of dielectric 12. Measurement of one or more electrical properties of dielectric 12 and/or region 16 of the semiconducting material adjacent the front surface 13 of semiconductor wafer 14 is accomplished by applying an electrical stimulus, e.g., a high frequency AC voltage, or a high frequency AC voltage combined with a DC bias voltage (CV) or a DC stress voltage or current (IV), between first electrical contact 32 and the second electrical contact, i.e., upper surface 28 of chuck 20 and, more particularly, between back surface 30 of semiconductor wafer 14 and upper surface 34 of dielectric 12. Measurement means 82 then measures the response to the applied electrical stimulus and determines from the response one or more electrical properties of dielectric 12 and/or region 16 of the semiconducting material adjacent the front surface 13 of semiconductor wafer 14.

As previously discussed, electrical properties of dielectric layers, such as silicon dioxide thin films, are usually studied by using the film as the dielectric in a fabricated MOS gate. This approach is time-consuming because it requires additional processing to create the MOS gates as previously discussed. Utilizing conductive probe 36 with an elastically deformable conductive tip 38 in contact with dielectric 12, it is possible to characterize thin dielectric films, for example, $SiO_2$ on silicon, quickly by forming a temporary small area MOS diode where tip 38 is the metal gate, dielectric 12 is the oxide, and the semiconducting material forming semiconductor wafer 14 is the semiconductor.

Utilizing the present invention, CV measurements are also easily performed to determine mobile ion density. Unlike the fabrication of metal or polysilicon gates, no additional processing steps are required. Measurements can be made immediately following a critical process step, such as gate oxidation.

The use of kinematic probe arm assembly 40 to control conductive probe 36 eliminates scrubbing of dielectric 12 by tip 38. Moreover, the radius and elasticity of tip 38 avoids penetration thereof into dielectric 12 thereby allowing measurements to be made on thin oxides. The kinematic probe arm assembly 40 in combination with the radius and elasticity of tip 38 enables measurements of semiconducting wafer 14 without damaging or contaminating dielectric 12 or the underlying semiconducting material. Furthermore, kinematic probe arm assembly 40 enables more accurate positioning and placement of conductive probe 36 and ensures that the contact formed between dielectric 12 and tip 38 is repeatable.

Since tip 38 of conductive probe 36 is elastically deformable, the contact area between tip 38 and dielectric 12 can be adjusted within the elastic limits of tip 38 by varying the load applied to tip 38 by kinematic probe arm assembly 40.

The mechanical contact area between tip 38 of conductive probe 36 and dielectric 12 can be determined by the well-known Hertzian formula related to elastic contacts between spherical and flat bodies. The effective contact area between tip 38 and dielectric 12 is the sum of the mechanical contact portion and the region adjacent to the mechanical contact portion where capacitive coupling is significant to the CV measurement. Preferably, the radius and smoothness of tip 38 is selected to maximize the mechanical contact portion and the region of capacitive coupling between tip 38 and dielectric 12.

As discussed above, the thick dielectric layers on semiconductor wafers in the early 1990's necessitated the use of probes having uniformly flat tips of the type and size disclosed in the above-mentioned Hillard patent in order to attempt CV measurements with a sufficient signal-to-noise ratio to allow characterization of properties of the dielectric layer. To this end, the uniformly flat tip of the probe disclosed in the Hillard patent involved formation of a relatively large contact area. However, even these relatively large contact areas were insufficient for accurate CV measurements.

At the time of the Hillard patent, conductive probe 36 having tip 38 with the above-described radius would not have been considered for use in performing CV measurements due to its reduced contact area versus the contact area formed by the uniformly flat tip of the probe disclosed in the Hillard patent. Hence, it has only been with the recent introduction of relatively thin dielectrics on semiconductor wafers that the use of elastically deformable and conductive tip 38 having a hemispherical or truncated sphere shape could be considered or utilized for conducting CV measurements.

To improve measurement quality, a flow of dry gas can be directed to the contact area between tip 38 and upper surface 34 of dielectric 12 to eliminate moisture thereon. Preferably, the gas is an inert gas, such as nitrogen.

Sometimes it will be preferable to apply the electrical stimulus through a front contact to the semiconducting material instead of through back surface 30 of semiconductor wafer 14. In these cases, a second kinematic probe, similar to the above-described conductive probe 36, will make contact through a "window" in dielectric 12, thereby replacing the electrical functions of chuck 20.

Dielectric 12 can include one or more dielectric layers formed on the semiconducting material of semiconductor wafer 14 by processing steps during the fabrication of semiconductor wafer 14. Alternatively, dielectric 12 can include a native dielectric layer formed on the semiconducting material of semiconductor wafer 14 in response to exposure of the semiconducting material to air. Combinations of a native dielectric layer and one or more dielectric layers formed by processing steps are also contemplated.

It is well-known in the art that certain semiconducting materials do not facilitate the formation of a native dielectric layer thereon when exposed to air. Moreover, because of the application of these semiconducting materials, it is not desirable to form dielectrics thereon during processing of the semiconducting material. In accordance with the present invention, the elastically deformable conductive tip 38 of conductive probe 36 can be utilized to perform measurements of the electrical properties of such semiconductor wafers 14. Specifically, tip 38 of conductive probe 36 can be moved into contact with upper surface 34 of semiconductor wafer 14 to form a Schottky diode. Measurement of one or more electrical properties of semiconductor wafer 14 absent dielectric 12 can be accomplished by applying an electrical stimulus, e.g., a high frequency AC voltage, or a high frequency AC voltage combined with a DC bias voltage (CV) or a DC stress voltage or current (IV), between semiconductor wafer 14 and tip 38. Measurement procedures and analyses are straightforward and known in the art.

Preferably, the elastically deformable and conductive material forming tip 38 is selected based upon whether tip 38 is to contact dielectric 12 or is to contact surface 13 of semiconductor wafer 14. Specifically, if tip 38 is configured to contact front surface 34 of dielectric 12, tip 38 is formed from a material having a first contact potential work function. In contrast, tip 38 is formed from a material having a second contact potential work function when tip 38 is configured to contact front surface 13 of semiconductor wafer 14.

Conductive probe 36 can also be received in an electrically conductive probe sleeve 102, shown in phantom in FIG. 4, and an insulator 104, also shown in phantom in FIG. 4, can be sandwiched between sleeve 102 and conductive probe 36. As shown in FIG. 4, probe sleeve 102 preferably extends along the length of conductive probe 36 and terminates before the distal end of tip 38. Sleeve 102 can be connected to an electrical ground 106 of measurement means 82 to shield conductive probe 36 from receiving electrical interference from external sources. Alternatively, sleeve 102 can be connected to an electrical signal chosen to minimize the effects of stray capacitance. More specifically, probe sleeve 102 can be connected to a bias circuit 108 which supplies to probe sleeve 102 an electrical signal which biases probe sleeve 102 to the same potential as tip 38 during application of the electrical stimulus between first electrical contact 32 and the second electrical contact defined by upper surface 28 of chuck 20.

Figure 9A:
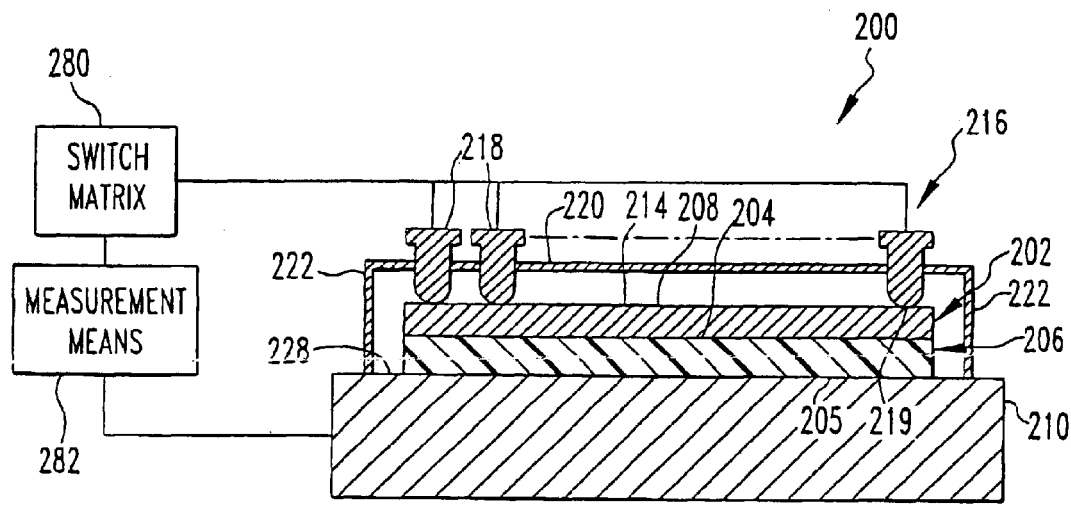
FIG. 9a is a side sectional view of a multi-probe holder in position above a semiconductor wafer with a back surface received on a chuck for testing in circuit with the measurement means.
Figure 9B:
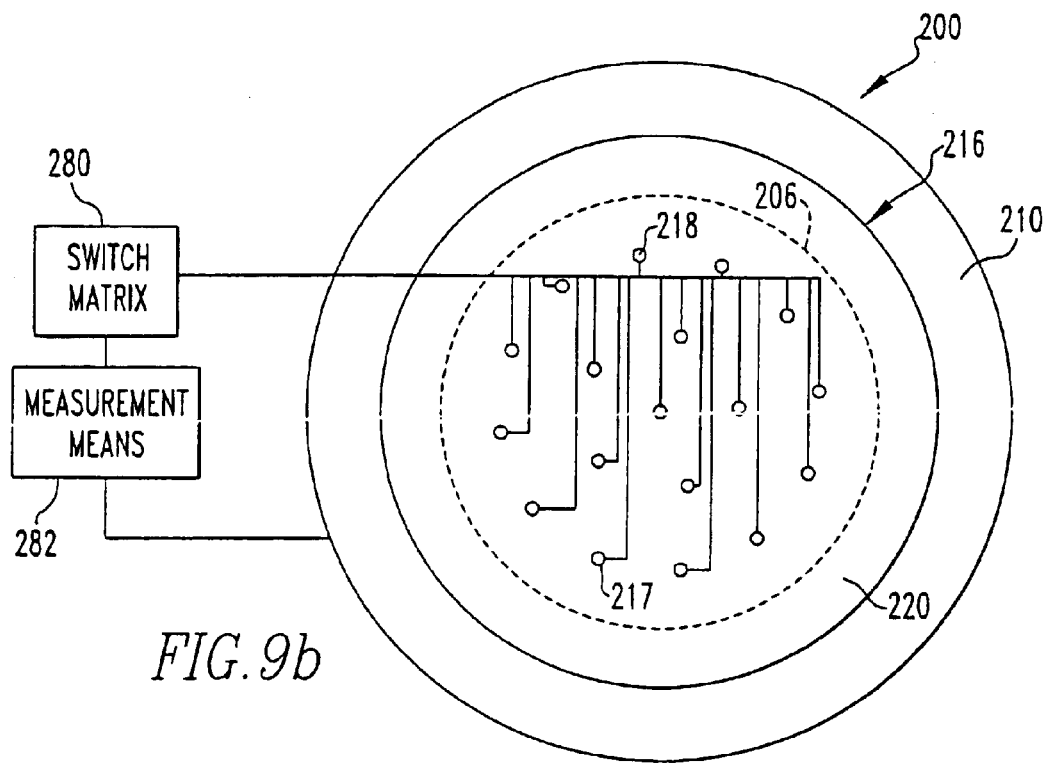
FIGS. 9b and 9c are top plan views of two embodiments of the multi-probe holder shown in FIG. 9 in position above the semiconductor wafer having its back surface received on a chuck for testing in circuit with the measurement means.
Figure 9C:
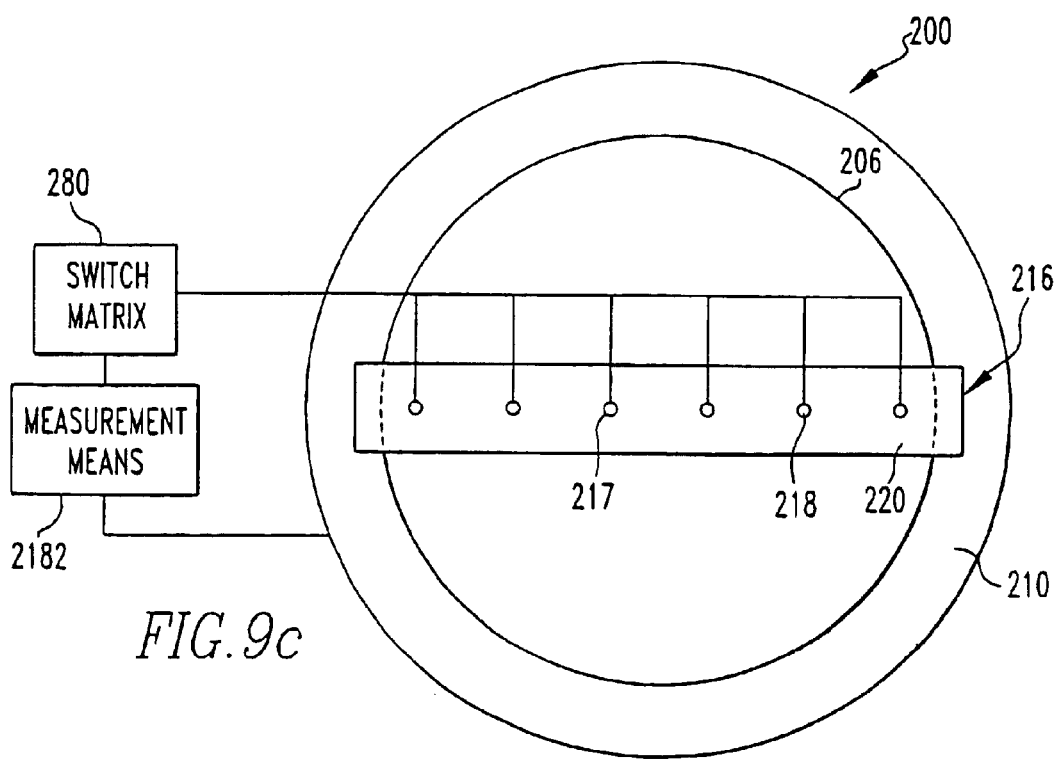

With reference to FIGS. 9a–9c, is an apparatus 200 for measuring electrical properties of a dielectric 202 on a front surface 204 of a semiconductor wafer 206 or in a region 208 of the semiconducting material forming semiconductor wafer 206 adjacent front surface 204 of semiconductor wafer 206 includes a vacuum chuck 210 that receives a back surface 205 of semiconductor wafer 206 and holds semiconductor wafer 206 by means of vacuum. Apparatus 200 also includes a multi-probe holder 216 having a plurality of conductive probes 218. Each conductive probe 218 has a configuration that corresponds to conductive probe 36 in the above discussed embodiment.

Multi-probe holder 216 includes a plate or arm 220 with each conductive probe 218 slidably received in a corresponding aperture 217 therethrough. Plate or arm 220 is preferably electrically nonconducting. However, plate or arm 220 can include an electrically nonconducting sleeve disposed (not shown) between each aperture 217, and the corresponding conductive probe 218 received therein. A sleeve or a plurality of probe legs 222 extend downward in the same direction as conductive probes 218 from plate or arm 220. Sleeve or probe legs 222 are connected to plate or arm 220 so that when plate or arm 220 is positioned over semiconductor wafer 206, sleeve or probe legs 222 extend between plate or arm 220 and top surface 228 of vacuum chuck 210.

In use, multi-probe holder 216 is lowered into position over semiconductor wafer 206 until sleeve or probe legs 222 contact the top surface 228 of vacuum chuck 210 whereupon tips 219 of conductive probes 218 contact front surface 214 of dielectric 202 or front surface 204 of semiconductor wafer 206 (when dielectric 202 is not present). Since conductive probes 218 are slidably received in apertures 217 of plate or arm 220, the only pressure applied to dielectric 202 or front surface 204 by each probe 218 is due to the weight thereof on its tip 219.

Figure 10A:
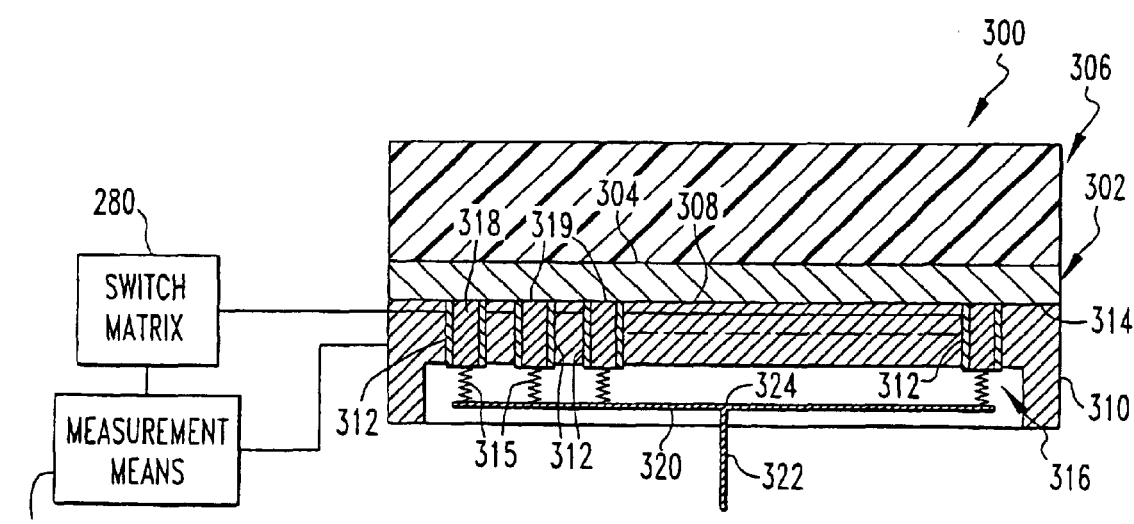
FIG. 10a is a side sectional view of a multi-probe holder in position below an inverted semiconductor wafer having its front surface received on a chuck for testing in circuit with the measurement means.
Figure 10B:
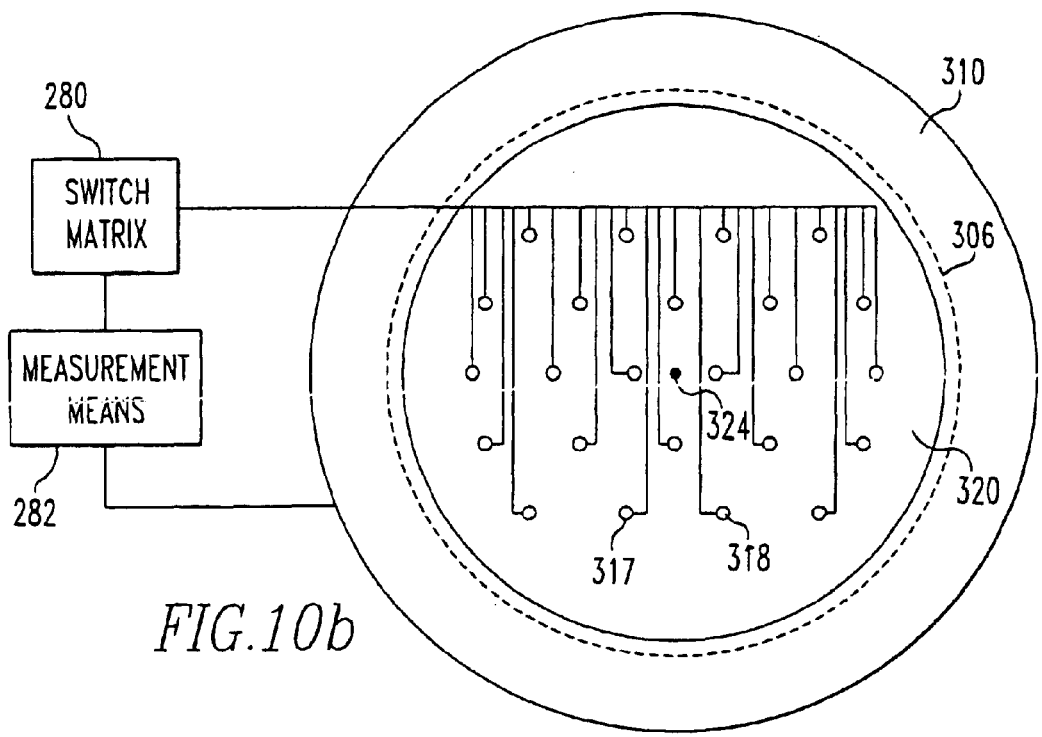
FIGS. 10b and 10c are bottom plan views of two embodiments of the multi-probe holder shown in FIG. 10a below an inverted semiconductor wafer having its front surface received on the chuck to be tested in circuit with the measurement means.
Figure 10C:
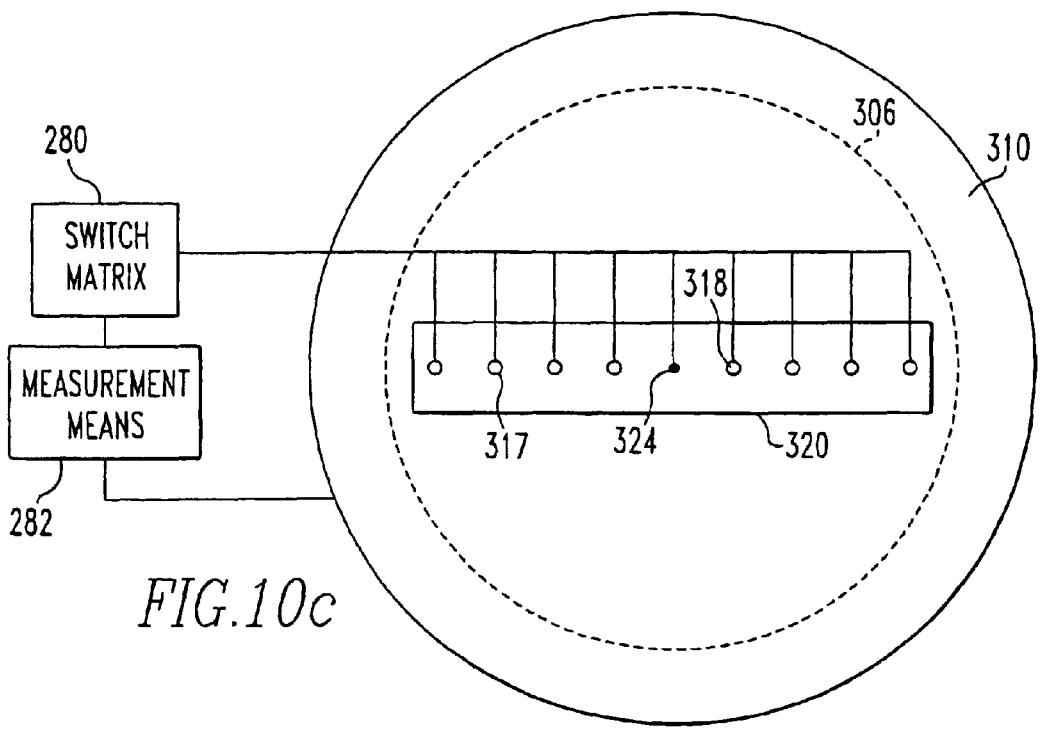

With reference to FIGS. 10a–10c, an apparatus 300 for measuring electrical properties of a dielectric 302 on a front surface 304 of a semiconductor wafer 306 or in a region 308 of the semiconducting material forming semiconductor wafer 306 adjacent front surface 304 of semiconductor wafer 306 includes a vacuum chuck 310 that receives front surface 314 of dielectric 302 or front surface 304 of semiconductor wafer 306 and holds semiconductor wafer 306 by means of vacuum.

Apparatus 300 also includes a multi-probe holder 316 having a plurality of conductive probes 318. Each conductive probe 318 has a configuration that corresponds to conductive probe 36 in the above-discussed embodiment. Multi-probe holder 316 includes a plate or arm 320 with each conductive probe 318 affixed thereto by a spring 315 configured to apply a spring force axially along the length of probe 318 in a direction away from plate or arm 320. Plate or arm 320 is preferably nonconductive. However, plate or arm 320 can include an electrically nonconducting insulator (not shown) between plate or arm 320 and each conductive probe 318. Each probe 318 is received in an aperture 317 which extends vertically through chuck 310. To avoid electrical contact between each probe 318 and its corresponding aperture 317 chuck 310 includes insulating sleeves 312 received in apertures 317. Each probe 318 is received in an insulating sleeve 312. A lifting mechanism (not shown) raises multi-probe holder 316 into a position whereupon tips 319 of conductive probes 318 press against front surface 314 of dielectric 302 or front surface 304 of semiconductor wafer 306 under the influence of spring 315. For example, plate or arm 320 may cooperate with the lifting mechanism through a probe post 322 extending from plate or arm 320 from an approximate center point 324 of plate or arm 320 in a direction opposite conductive probes 318.

Referring to FIGS. 9a–9c and 10a–10c, each conductive probe 218, 318 is electrically connected to a switch matrix 280 and a measurement means 282 which takes measurements. For each measurement taken, one probe 218, 318 is selected via switch matrix 280 to apply a suitable measurement stimulus to and remaining probes 218, 318 are connected to ground. A measurement stimulus is then applied to the one selected probe 218, 318, and the response is measured and recorded as discussed in relation to the previous embodiment. This process is repeated for taking measurements with each conductive probe 218, 318.

In another embodiment of the present invention, probes 36, 218, and 318, discussed above, enable CV and IV measurements to be performed in scribe lines of product semiconductor wafers without having to first form polysilicon gates. Specifically, the diameter of tips 38, 219, and 319 are preferably smaller than the width of the scribe lines of product semiconductor wafers that probes 36, 218, and 318 would be utilized to test. For example, in one non-limiting embodiment, the diameter of a probe tip in accordance with the present invention is less than or equal to 0.1 mm.

When tips 38, 219, and 319 are positioned to contact front surface 34, 214, 314 of dielectric 12, 202, 302 or front surface 13, 204, 304 of semiconductor wafer 14, 206, 306, tips 38, 219, and 319 are applied to the scribe lines of semiconductor wafers 14, 206, 306. The measurements are then taken. Conducting CV and IV measurements by application of conductive probes 36, 218, and 318 to scribe lines of product semiconductor wafers 14, 206, 306 eliminates the need to form test structures in the scribe lines. To this end, conductive probes 36, 218, and 318 themselves form, with the dielectric 12, 202, 302 on the front surface 13, 204, 304 of the semiconductor wafer 14, 206, 306 or the front surface 13, 204, 304 of the semiconductor wafer 14, 206, 306 absent the dielectric thereon, the necessary test structure to enable CV and IV measurements to be made on the product semiconductor wafers 14, 206, 306. This, in turn, allows very fast CV and IV measurements to be made on product semiconductor wafers 14, 206, 306 and eliminates the need for monitor or test semiconductor wafers.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

I claim:

1. A semiconductor wafer multi-probe assembly, comprising:
    a chuck assembly configured to receive a surface of a semiconductor wafer;
    a multi-probe holder having a plurality of probes, each of the plurality of probes having an elastically deformable conductive tip movable into contact with (i) a front surface of a dielectric formed on a front surface of semiconducting material forming the semiconducting wafer or (ii) a front surface of the semiconducting material; and
    a means for selectively applying an electrical stimulus to each elastically deformable conductive tip, for measuring a response to the electrical stimulus, and for determining from the response at least one electrical property of the dielectric and/or the semiconducting material,
    wherein when each elastically deformable conductive tip is in contact with the semiconducting material, said means applies a capacitance-voltage (CV), a capacitance-time (Ct), a conductance-voltage (GV) or current-voltage (IV) type electrical stimulus and measures the respective CV, Ct, GV or IV response of the semiconducting material to the electrical stimulus.

2. The semiconductor wafer multi-probe assembly as set forth in claim 1, wherein the chuck assembly receives a back surface of the semiconductor wafer.

3. The semiconductor wafer multi-probe assembly as set forth in claim 2, wherein the multi-probe holder further includes a plate with a plurality of apertures, with each probe slidably received in a corresponding aperture.

4. The semiconductor wafer multi-probe assembly as set forth in claim 3, wherein:
    the multi-probe holder further includes a sleeve extending from the plate in the same direction as the conductive probes, and
    when the plate is positioned over the semiconductor wafer, the sleeve contacts the chuck assembly to locate each of the tips of the plurality of probes in contact with the front surface of the dielectric or the front surface of the semiconducting material.

5. The semiconductor wafer multi-probe assembly as set forth in claim 3, wherein:
    the multi-probe holder further includes a plurality of legs extending from the plate in the same direction as the conductive probes, and
    when the plate is positioned over the semiconductor wafer, the plurality of legs contacts the chuck assembly to locate each of the tips of the plurality of probes in contact with the front surface of the dielectric or the front surface of the semiconducting material.

6. The semiconductor wafer multi-probe assembly as set forth in claim 2, wherein the multi-probe holder further includes an arm with a plurality of apertures, with each probe slidably received in a corresponding aperture.

7. The semiconductor wafer multi-probe assembly as set forth in claim 6, wherein:
    the multi-probe holder further includes a sleeve extending from the arm in the same direction as the conductive probes, and
    when the arm is positioned over the semiconductor wafer, the sleeve contacts the vacuum chuck to locate each of the tips of the plurality of probes in contact with the front surface of the dielectric or the front surface of the semiconducting material.

8. The semiconductor wafer multi-probe assembly as set forth in claim 6, wherein:
    the multi-probe holder further includes a plurality of legs extending from the arm in the same direction as the conductive probes, and
    when the plate is positioned over the semiconductor wafer, the plurality of legs contacts the vacuum chuck to locate each of the tips of the plurality of probes in contact with the front surface of the dielectric or the front surface of the semiconducting material.

9. The semiconductor wafer multi-probe assembly as set forth in claim 1, wherein the chuck assembly receives a front surface of the semiconductor wafer.

10. The semiconductor wafer multi-probe assembly as set forth in claim 9, wherein the multi-probe holder further includes a plate with each probe affixed to the plate by a spring configured to apply a spring force axially along a length of the probe in a direction away from the plate.

11. The semiconductor wafer multi-probe assembly as set forth in claim 9, wherein the multi-probe holder further includes an arm with each probe affixed to the arm by a spring configured to apply a spring force axially along a length of the probe in a direction away from the plate.

12. The semiconductor wafer multi-probe assembly as set forth in claim 9, wherein the chuck assembly further includes a plurality of apertures extending therethrough, with each probe slidably received within a corresponding aperture.

13. The semiconductor wafer multi-probe assembly as set forth in claim 12, wherein the multi-probe holder further includes a plurality of sleeves, with each sleeve received in a corresponding aperture such that each probe is slidably received in a corresponding sleeve.

14. The semiconductor wafer multi-probe assembly as set forth in claim 9, wherein the multi-probe holder is coupled with a lifting mechanism which raises the multi-probe holder into a position where each of the tips of the plurality of probes presses against the front surface of the dielectric or the front surface of the semiconducting material.

15. A method of measuring at least one electrical property of a semiconductor wafer, the method comprising the steps of:

(a) providing a probe having an elastically deformable conductive tip;

(b) forming a first electrical contact between the tip and a scribe line of the semiconductor wafer;

(c) forming a second electrical contact with the semiconductor wafer;

(d) applying a capacitance-voltage (CV), a capacitance-time (Ct), a capacitance-voltage (GV) or current-voltage (IV) type electrical stimulus between the first electrical contact and the second electrical contact;

(e) measuring a CV, Ct, GV or IV response of the semiconductor wafer to the electrical stimulus; and (f) determining from the response at least one electrical property of the semiconductor wafer.

16. The method as set forth in claim 15, wherein:

in step (a) a plurality of probes is provided;

in step (b) one tip of one of the plurality of probes forms a first electrical contact with a scribe line of the semiconductor wafer; and in step (c) the remaining tips of the plurality of probes form the second electrical contact with scribe lines of the semiconductor wafer, wherein the second electrical contact is a series of ground contacts.

17. The method as set forth in claim 16, further including the step of repeating steps (b)–(f) for each of the plurality of probes.

* * * * *

UNITED STATES PATENT AND TRADEMARK OFFICE
CERTIFICATE OF CORRECTION

PATENT NO. : 6,842,029 B2
APPLICATION NO. : 10/120661
DATED : January 11, 2005
INVENTOR(S) : Howland It is certified that error appears in the above-identified patent and that said Letters Patent is hereby corrected as shown below:

Title Page, (56) References Cited, insert the following U.S. Patents:

| | | |
|---|---|---|
| 5,508,527 | 04/1996 | Kuroda et al. |
| 5,585,736 | 12/1996 | Hshieh et al. |
| 5,786,231 | 07/1998 | Warren et al. |
| 6,144,039 | 11/2000 | Hshieh |
| 6,171,872 | 01/2001 | Lowrey et al. |
| 6,232,143 | 05/2001 | Maddix et al. |
| 6,258,614 | 07/2001 | Kaneko |
| 6,265,890 | 07/2001 | Chacon et al. |
| 4,951,370 | 08/1990 | Reid |

Column 7, Line 42, "is an apparatus" should read -- an apparatus --

Signed and Sealed this

Thirtieth Day of October, 2007

JON W. DUDAS
*Director of the United States Patent and Trademark Office*